US009362324B1

(12) United States Patent
Astratov et al.

(10) Patent No.: US 9,362,324 B1
(45) Date of Patent: Jun. 7, 2016

(54) PHOTODETECTOR FOCAL PLANE ARRAY SYSTEMS AND METHODS

(71) Applicants: Vasily N. Astratov, Charlotte, NC (US); Kenneth W. Allen, Jr., Shelby, NC (US); Nicholaos I. Limberopoulos, Beavercreek, OH (US); Augustine Urbas, Cincinnati, OH (US); Joshua M. Duran, Charlotte, NC (US)

(72) Inventors: Vasily N. Astratov, Charlotte, NC (US); Kenneth W. Allen, Jr., Shelby, NC (US); Nicholaos I. Limberopoulos, Beavercreek, OH (US); Augustine Urbas, Cincinnati, OH (US); Joshua M. Duran, Charlotte, NC (US)

(73) Assignee: The University of North Carolina at Charlotte, Charlotte, NC (US)

( * ) Notice: Subject to any disclaimer, the term of this patent is extended or adjusted under 35 U.S.C. 154(b) by 0 days.

(21) Appl. No.: 14/587,068

(22) Filed: Dec. 31, 2014

(51) Int. Cl.
*B05D 3/12* (2006.01)
*H01L 27/146* (2006.01)

(52) U.S. Cl.
CPC .... *H01L 27/14627* (2013.01); *H01L 27/14649* (2013.01); *H01L 27/14685* (2013.01)

(58) Field of Classification Search
CPC ...... B05D 3/12; B81C 1/00031; B82Y 15/00; B82Y 20/00; B82Y 30/00; C23C 18/0605; C30B 29/58; C30B 7/02; H01L 21/0337; G02B 6/0096; G02B 6/32; G02B 6/4206; G02B 1/005; G02B 3/0018; G02B 3/0056
See application file for complete search history.

(56) References Cited

U.S. PATENT DOCUMENTS

| 7,057,832 | B2 | 6/2006 | Wu et al. |
| 8,554,031 | B2 | 10/2013 | Astratov |
| 2012/0060913 | A1* | 3/2012 | Grandidier ............. B82Y 30/00 136/256 |
| 2013/0338303 | A1 | 12/2013 | Quint et al. |

OTHER PUBLICATIONS

"Plasmonic-Enhanced Phtodetectors for Pocal Plane Arrays," Lee et al, IEEE Photonics Technology Letters, vol. 23, No. 14, Jul. 15, 2011.*
"Directed Self-Assembly of Sherical Particles on Patterned Electrodes by an Applied Electric Field," Winkleman et al., Advanced Materials 2005, No. 17, pp. 1507-1511).*
Hasan et al., "Photonic nanojet-enhanced nanometer-scale germanium photodiode," Department of Electrical and Computer Engineering, University of Utah, Jul. 24, 2013, pp. 5420-5425.
(Continued)

*Primary Examiner* — Roy Potter
*Assistant Examiner* — Paul Patton
(74) *Attorney, Agent, or Firm* — Clements Bernard PLLC; Christopher L. Bernard; Lawrence A. Baratta, Jr.

(57) ABSTRACT

A photodetector focal plane array system, comprising: a substrate comprising a plurality of photosensitive regions; and a microcomponent disposed adjacent to each of the plurality of photosensitive regions operable for receiving incident radiation and directing a photonic nanojet into the associated photosensitive region. Optionally, each of the microcomponents comprises one of a microsphere and a microcylinder. Each of the microcomponents has a diameter of between between $\sim\lambda$ and $\sim100\lambda$, where $\lambda$ is the wavelength of the incident radiation. Each of the microcomponents is manufactured from a dielectric or semiconductor material. Each of the microcomponents has an index of refraction of between $\sim1.4$ and $\sim3.5$. Optionally, high-index components can be embedded in a lower index material. The microcomponents form an array of microcomponents disposed adjacent to the substrate.

22 Claims, 5 Drawing Sheets

(56) References Cited

OTHER PUBLICATIONS

Lu et al., "A Self-Assembly Approach to the Fabrication of Patterned, Two-Dimensional Arrays of Microlenses of Organic Polymers," Advanced Materials, vol. 13, No. 1, Jan. 5, 2001, pp. 34-37.Apr. 16, 2001.

Wu et al., "Fabrication of arrays of two-dimensional micropatterns using microspheres as lenses for projection photolithography," Department of Chemistry and Chemical Biology, Harvard University, Applied Physics Letters vol. 78, No. 16, Apr. 16, 2001, pp. 2273-2275.

Wu et al., "Plasmonic enhanced quantum well infrared photodetector with high detectivity," Department of Electrical Engineering and Computer Science, Northwestern University, Applied Physics Letters 96, 2010, pp. 1-3.

Winkleman et al., "Directed Self-Assembly of Spherical Particles on Patterned Electrodes by an Applied Electric Field," Advanced Materials, 2005, pp. 1507-1511.

Schaadt et al., "Enhanced semiconductor optical absorption via surface plasmon excitation in metal nanoparticles," Applied Physics Letters 86, 2005, pp. 1-4.

Keasler et al., "A numerical study of broadband absorbers for visible to infrared detectors," Applied Physics Letters 99, 2011, pp. 1-4.

Catrysse et al., "Pixel scaling in infrared focal plane arrays," Stanford University, Feb. 18, 2013, pp. C72-C77.

Jiang et al., "Advanced monolithic quantum well infrared photodetector focal plane array integrated with silicon readout integrated circuit," Department of Electrical and Computer Engineering, Northwestern University, Oct. 13, 2003, pp. 199-207.

Lee et al., "Plasmonic-Enhanced Photodetectors for Focal Plane Arrays," IEEE Photonics Technology Letters, vol. 23, No. 14, Jul. 15, 2011, pp. 935-937.

Winkleman et al., "Templated Self-Assembly Over Patterned Electrodes by an Applied Electric Field: Geometric Constraints and Diversity of Materials," Journal of Microelectromechanical Systems, 2008, pp. 1-11.

Chen et al., "Photonic nanojet enhancement of backscattering of light by nanoparticles: a potential novel visible-light ultramicroscopy technique," Department of Electrical and Computer Engineering and Department of Biomedical Engineering, Northwestern University, vol. 12, No. 7, Apr. 5, 2004, pp. 1214-1220.

Lee et al., "Quantum dot infrared photodetector enhanced by surface plasma wave excitation," Center for High Technology Materials and Department of Electrical and Computer Engineering, University of New Mexico, vol. 17, No. 25, Dec. 7, 2009, pp. 23160-23168.

Ren et al., "Second-order surface-plasmon assisted responsivity enhancement in germanium nanophotodetectors with bull's eye antennas," Department of Electronic Materials Engineering, The Australian National University, vol. 22, No. 13, pp. 15949-15956.

Darafsheh, "Formation of polarized beams in chains of dielectric spheres and cylinders," Department of Physics and Optical Science, University of North Carolina at Charlotte, Optics Letters, vol. 38, No. 20, Oct. 15, 2013, pp. 4208-4211.

Yu et al., "Design of mid-infrared photodetectors enhanced by surface plasmons on grating structures," Stanford University, vol. 6475, pp. 1-6.

Gu et al., "Backside-configured surface plasmonic structure with over 40 times photocurrent enhancement," Department of Electrical and Computer Engineering, University of Massachusetts Lowell, Jul. 31, 2013, pp. 1-7.

* cited by examiner (a)

(b)

(c)

PHOTODETECTOR FOCAL PLANE ARRAY SYSTEMS AND METHODS

FIELD OF THE INVENTION

The present invention relates generally to imaging systems and methods, such as military and civil infrared (IR) imaging systems and methods and the like. More specifically, the present invention relates to photodetector focal plane array (FPA) systems and methods for use with such imaging systems and methods.

BACKGROUND OF THE INVENTION

The present invention relates generally to FPAs. FPAs are widely used in military and civil IR imaging systems and the like, such as systems for guidance and control, target acquisition, surveillance, laser range-finding, fiber-optic and free-space communications, thermal imaging, and other applications. More specifically, the present invention addresses the problem of designing FPAs that are capable of detecting weak optical images with a sufficiently large angle-of-view (AOV).

For IR applications, the photosensitive material of FPAs is typically fabricated from narrow-band gap semiconductors, such as $Hg_{1-x}Cd_xTe$ (mercury-cadmium-telluride (MCT)), or from intersubband-absorbing layered quantum structures, such as strained-layer superlattices or quantum dots. The pixels of such FPAs are represented by a semiconductor pin structure operating in a photovoltaic or photoconductive mode. Referring to FIG. 1(a), the structure of the individual photodetector (or a "pixel") of the FPAs 10 includes a substrate 12, contact layers formed by highly doped semiconductor regions 13, ohmic (metallic) contacts 14, barrier layers 15, and a photosensitive layer 16. The structure of the individual photodetector can also contain additional layers, such as anti-reflection coatings, etc. As shown in FIG. 1(b), the individual pixels are fabricated as a two-dimensional array in the focal plane of the imaging system forming so-called "focal plane array" 10. As illustrated in FIG. 1(c), the metallic electrodes 20 connecting each pixel with an electronic circuitry are a part of the design of such FPA assemblies 10. The location of the array of dielectric microspheres 30 of the present invention, described in greater detail herein below, is also illustrated, but is not part of the conventional FPA assembly 10. The dielectric microsphere 30 is positioned just above the photodetector mesa allowing efficient coupling of light into the photosensitive layer.

The layered quantum structures are represented by quantum well (QWIP), quantum dot (QDIP), or strained-layer superlattice (SLSIP) IR photodetectors, which are usually fabricated on GaAs or InP substrates. The electronic processing circuitry can be created by using wire-bonding or by using flip-chip bonding with a silicon-based readout integrated circuit (IC).

It is important to note that one of the main trends in FPA design is the reduction of pixel size. Smaller pixels provide better resolution and increased spatial sampling. The reduction of pixel size also results in reduced FPA dark current. In addition, the frequency response of the individual pixels can be enhanced due to reduced capacitance. Pixel sizes in FPAs used in mid-wave IR (MWIR, $\lambda$=3-5 μm) and long-wave IR (LWIR, $\lambda$=8-12 μm) systems are now being reduced below 20 μm, approaching the diffraction limit of conventional imaging optics.

The reduction of pixel sizes and the need to allocate a significant fraction of the FPA area for electronic processing circuitry reduces the sensitivity of the arrays. Such arrays can be characterized by the pixels' area fill factor, which can be on the order of few percent in QWIPs or QDIPs.

The sensitivity of individual pixels can in principle be enhanced by increasing their absorbance. This can be achieved by structuring the surface of the pixels or by fabricating plasmonic nanogratings, for example. It has been demonstrated that the photoresponse of QWIP and QDIP structures can be enhanced through the use of metal nanoparticles, antennas, and metal gratings fabricated on the surface of the devices. The idea behind these designs is to couple incident light to surface plasmons bound to the metal/semiconductor interface, leading to enhanced responsivity and detectivity. Recently, a notable advance in this field has been made based on the use of substrate-side illumination, as opposed to air-side illumination.

It should be noted, however, that all of these designs do not address the problem related to the pixels' area fill factor being limited at the level of a few percent, which leads to relatively inefficient collection of light in conventional QWIP, QDIP, and SLSIP structures.

It should also be noted that a standard solution of the problem of increasing collection of light by FPAs is based on using microlens arrays fabricated by standard fabrication technologies such as photolithography followed by etching or by other methods. Speaking about the light collection only, microlens arrays provide very high light collection efficiency, something on the order of 70-80% depending on the fine features of the design. However, this advantage of such commercial off-the-shelf (COTS) microlenses should be considered along with their AOV for developing practical imaging devices. The AOVs of the COTS microlenses are too small for developing practical mid-IR imagers. The angle of view (a) can be calculated from the chosen diameter of the photosensitive area (pixel diameter) (d), and effective focal length (f) as follows:

$$a = 2 \arctan d/2f, \quad (1)$$

For d=30 μm photodetector mesas, assuming f=200 μm, one can estimated AOV=8.6 deg. For d=12 μm mesas, AOV=3.4 deg. Such AOVs are too small for most of mid-IR imaging applications.

The way of increasing AOV is connected with decreasing the effective focal length f. However, COTS microlenses are limited in this regard because of their limited refractive index contrast and their dome shape. The present invention addresses this and other issues suggesting a solution of the problem of high efficiency of collection of light combined with large AOV.

BRIEF SUMMARY OF THE INVENTION

The present invention is devoted to new FPA systems and methods providing enhanced sensitivity, reduced dark current, increased speed, and improved angular characteristics. The proposed systems and methods are based on the assembly of an array of dielectric microspheres at the top of the FPA in such a way that individual microspheres are positioned above the photosensitive regions of the FPA. These regions can be represented by pin junctions containing quantum wells, quantum dots, strained-layer superlattices or other materials with light absorption properties in the desired spectral range. Dielectric microspheres provide strong concentration of electromagnetic power, sometimes termed the "photonic nanojet" effect, directly into the photosensitive regions of the FPA. This is provided through the mesas fabricated at the surface of FPA. This leads to improved efficiency in the collection of light in such structures. The subwavelength width of the photonic nanojets allows using mesas with wavelength-scale dimensions, which results in reduced dark current and increased frequency response of the FPAs. The parameters of the microspheres are optimized for a given FPA to achieve the best focusing properties at the optimal depth inside the structure. The typical values of the index of refraction (n) and the diameter (D) of the microspheres are within $1.4<n<2.0$ and $2\lambda<D<100\lambda$ ranges, by way of example only. The light collection efficiency is improved due to the fact that the sphere diameter, D, can be much larger than the pixel diameter, d. AOV is improved due to the fact that microspheres with spherical shape have stronger focusing capability compared to dome-shaped COTs microlenses. Another important factor is that the microspheres can be easily fabricated using relatively high-index materials ($n>1.6$). Such microspheres are particularly efficient for reducing f. In fact, the spheres with n~1.8 focuses the collimated beam close to the back (not illuminated) surface of the sphere which means that the condition f~D/2 can be approached in such structures. Simple estimation based on Eq. (1) shows that d=12 μm mesas integrated with D=50 μm spheres should possess AOV=27 deg which is significantly larger angle compared to AOV provided by COT microlenses. Two times larger spheres with D=100 μm should still have sufficiently large AOV=13.7 deg. In addition to AOV advantage, such spheres would also provide significantly higher efficiency of collection of light compared to the same structures without spheres. The efficiency advantage can be estimated as $(1-k)^2 \times (D/d)^2$, where k is the total amplitude reflection coefficient of the microspherical surface. The efficiency advantage on the order of 50-60 can be obtained for d=12 μm mesas integrated with D=100 μm spheres. In the proposed designs there is a trade-off between the light collection efficiency advantage over bare structures (no spheres) and AOV advantage over structures integrated with COT microlenses. Generally speaking, larger spheres favor higher light collection efficiencies by the expense of AOV. However, in terms of the parameters required for imaging applications, the proposed structures over perform bare structures and structures equipped with COT microlenses. The positioning of a large number of microspheres can be performed by various self-assembly and micro-manipulation techniques. After that, the microspheres are fixed using glues, epoxies, or, more generally, materials with the ability to solidify, photocurable materials, temperature-curable materials, etc., or by other such techniques. In particular, a deliberate temperature treatment can be used to slightly melt of soften the material of the spheres or material of the adjacent layers to fix the spheres exactly above the detector mesas.

Similar mechanisms of the enhancement of light collection efficiency and improvement of AOV can be realized by using a microcylindrical lens arrays assembled at the top of the photodetector arrays. In this case, the focusing is provided in only one direction perpendicular to the microcylinder axis. This means that the enhancement of light collection can be smaller than that for spheres, but it can still be significantly improved compared to that in bare photodetector arrays. The advantage of microcylindrical arrays is that they can be obtained from microfibers with relatively well reproducible diameters. In fact, standard single-mode telecom fibers with extremely well preserved diameter 125 μm can be used for this purpose. Another advantage of such structures is connected with their potentially simple manufacturability (close-packed array of microfibers) and their extremely large area fill factor which can reach unity and exceeds the area fill factor for close-packed arrays of microspheres.

In one exemplary embodiment, the present invention provides a photodetector focal plane array system, comprising: a substrate comprising a plurality of photosensitive regions; and a microcomponent disposed adjacent to each of the plurality of photosensitive regions operable for receiving incident radiation and directing a photonic nanojet into the associated photosensitive region. Optionally, the plurality of photosentive regions are disposed in a photosensitive layer of the substrate. Optionally, each of the microcomponents comprises one of a microsphere or a microcylinder. Each of the microcomponents has a diameter of between $2\lambda<D<100\lambda$, so that in mid-IR range of operation the typical diameters are between 8 and 400 micron. Each of the microcomponents is manufactured from a dielectric or semiconductor material. Optionally, the dielectric material comprises one of barium titanate glass, titanium dioxide, sapphire, ruby, polystyrene, soda-lime glass, silica, borosilicate glass, calcium fluoride, magnesium fluoride, or other materials. Each of the dielectric microcomponents has an index of refraction of between 1.4 and 2.2. Semiconductor materials usually have higher indices of refraction than needed for optimal focusing near the surface of the spheres. However, they can be used for these applications if they are embedded in the materials with an intermediate index of refraction. Semiconductor spheres can be made from silicon, germanium, GaAs, or other materials. The refractive index of microspheres can be smaller than the bulk values. The semiconductor spheres can have indices from 2.2 to 3.5 in the optical range. They can be embedded in PDMS, photoresist or other materials which typically have indices in 1.4-1.6 range. The microcomponents are assembled with the substrate using one or more of the following techniques: i) self-assembly under wet conditions due to meniscus forces, ii) the use of a patterned substrate, iii) the use of an electric field, iv) the use of shear force, v) the use of conventional or optoelectonic tweezers, vi) the use of a magnetic field, vii) self-assembly under dry conditions, viii) the use of vacuum tweezers, ix) the use of capillary grippers, and x) the use of suction arrays. Optionally, the microcomponents are affixed to the substrate using one or more of a glue, an epoxy, a polymeric material, a photocurable material, and partial or complete melting. The micrcomponents form an array of microcomponents disposed adjacent to the substrate.

In another exemplary embodiment, the present invention provides a photodetector focal plane array method, comprising: providing a substrate comprising a plurality of photosensitive regions; and disposing a microcomponent adjacent to each of the plurality of photosensitive regions operable for receiving incident radiation and directing a photonic nanojet into the associated photosensitive region. Optionally, the plurality of photosentive regions are disposed in a photosensitive layer of the substrate. Optionally, each of the microcomponents comprises one of a microsphere or a microcylinder. Each of the microcomponents has a diameter of between $2\lambda<D<100\lambda$, so that in mid-IR range of operation the typical diameters are between 8 and 400 micron. Each of the microcomponents is manufactured from a dielectric or semiconductor material. Optionally, the dielectric material comprises one of barium titanate glass, titanium dioxide, sapphire, ruby, polystyrene, soda-lime glass, silica, borosilicate glass, calcium fluoride, magnesium fluoride, or other materials. Each of the dielectric microcomponents has an index of refraction of between 1.4 and 2.2. Semiconductor materials usually have higher indices of refraction than needed for optimal focusing near the surface of the spheres. However, they can be used for these applications if they are embedded in the materials with an intermediate index of refraction. Semiconductor spheres can be made from silicon, germanium, GaAs, or other materials. The refractive index of microspheres can be smaller than the bulk values. The semiconductor spheres can have indices from 2.2 to 3.5 in the optical range. They can be embedded in PDMS, photoresist or other materials which typically have indices in 1.4-1.6 range. The microcomponents are assembled with the substrate using one or more of the following techniques: i) self-assembly under wet conditions due to meniscus forces, ii) the use of a patterned substrate, iii) the use of an electric field, iv) the use of shear force, v) the use of conventional or optoelectonic tweezers, vi) the use of a magnetic field, vii) self-assembly under dry conditions, viii) the use of vacuum tweezers, ix) the use of capillary grippers, and x) the use of suction arrays. Optionally, the microcomponents are affixed to the substrate using one or more of a glue, an epoxy, a polymeric material, a photocurable material, and partial or complete melting. The micrcomponents form an array of microcomponents disposed adjacent to the substrate.

BRIEF DESCRIPTION OF THE DRAWINGS

The present invention is illustrated and described herein with reference to the various drawings, in which like reference numbers are used to denote like system components/method steps, as appropriate, and in which.

DETAILED DESCRIPTION OF THE INVENTION

Figure 1:
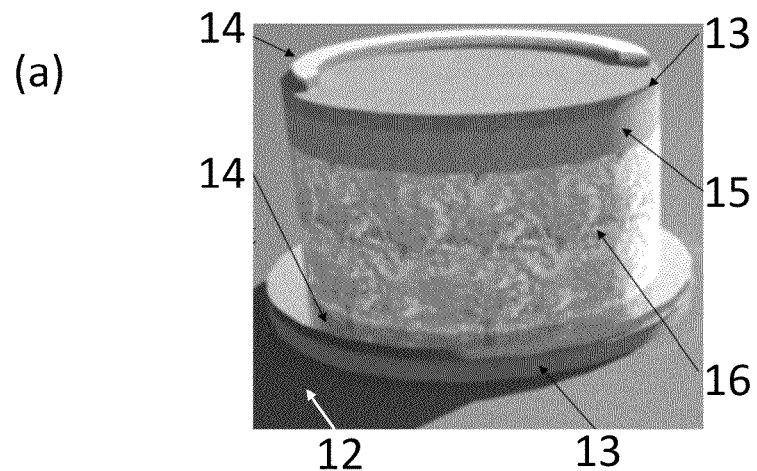
FIG. 1 illustrates (a) a structure of individual photodetector (or a "pixel"), (b) a typical FPA represented by an array of pixels, and (c) an individual photodetector with metallic contacts before and after integration with 90 μm polystyrene microsphere.
Figure 1:
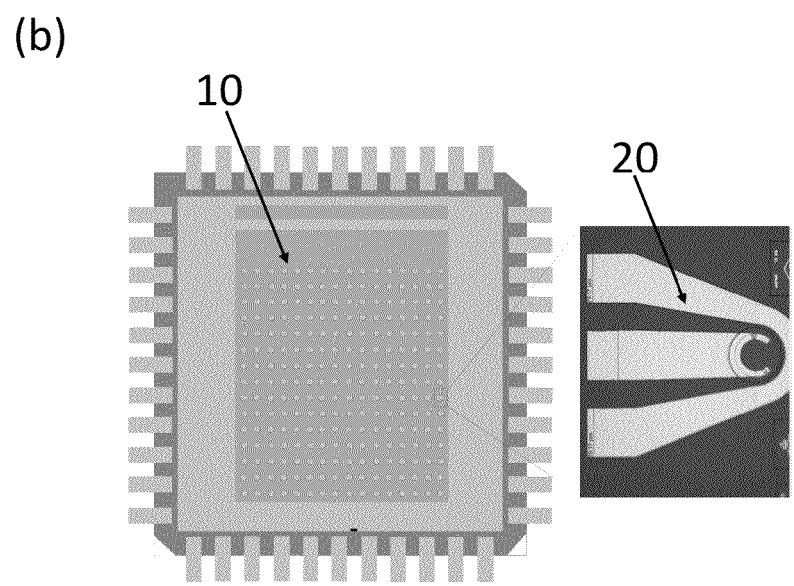
Figure 1:
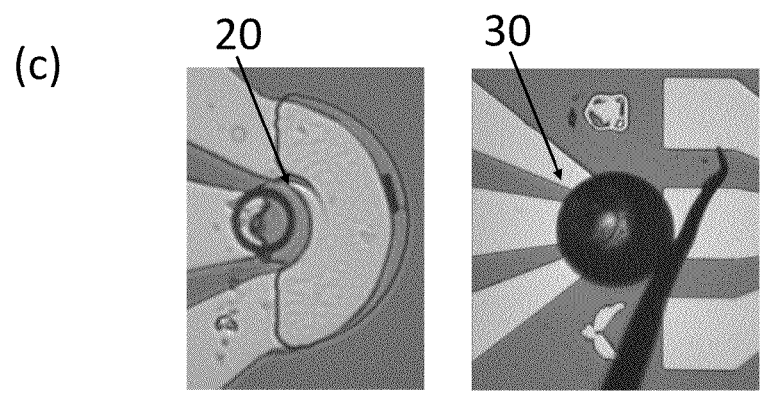

By way of enabling background, prior work has taken place in three main areas: i) developing the general concept of photonic nanojets; ii) developing techniques for the self-assembly of microspheres; and iii) developing micro-assembly technologies, such as vacuum or suction tweezers and grippers.

Photonic nanojets. It has been proposed that dielectric spheres can be used for obtaining tightly focused beams with lateral dimensions which can be smaller than the diffraction limit. Such tightly focused beams have been termed "photonic nanojets." These photonic nanojets appear for a wide range of diameters of microspheres, typically in a $2\lambda<D<100\lambda$ range, with the refractive index contrast relative to the background typically in a $1.4<n<2.0$ range. Many applications of photonic nanojets have been proposed, including polarization filters based on chains of spheres and focusing single-mode and multi-mode microprobes. More recently, an application of photonic nanojets for focusing electromagnetic energy into a photodiode has been proposed. However, the enhancement of the performance of photodetector FPAs based on using an ordered array of spheres has not been proposed or contemplated.

Self-assembly of microspheres. Many methods for the self-assembly of microspheres have been developed in the material science community. Most of these studies have been focused on self-assembly under wet conditions, where capillary forces between components exist due to menisci forming between the components. Such capillary forces bring the components together to minimize the interfacial free energy of the system. These methods allow the fabrication of extremely long and straight chains of touching microspheres and two-dimensional (2D) arrays of spheres. An additional control of self-assembly is provided by the patterned substrate, which allows obtaining ordered clusters of spheres. Another example is given by the self-assembly of microspheres on patterned electrodes by an applied electric field. Ordered 2D arrays of 100 μm glass microspheres with a 1% defect rate have been obtained by this method. Another example is represented by a method using a shear force in the course of drying the suspension. Another example is given by the self-assembly of microspheres in a magnetic field. In the magnetic field methods, micron to millimeter-sized spheres can be manipulated by immersing them in a dispersion of colloidal, magnetic nanoparticles. Another example is given by synthetic opals, where silica spheres with submicron diameters are packed in relatively ordered three-dimensional (3D) structures. In addition to wet fabrication techniques, the template self-assembly of microspheres into ordered 2D arrays has been developed under dry conditions.

Optical tweezers. Microspherical arrays can be assembled using parallel manipulation of microspheres by conventional or optoelectronic tweezers.

Micro-assembly technologies. A whole class of manipulation and gripping technologies has been developed based on using vacuum tweezers, capillary grippers, and other similar methods. These techniques represent a more "deterministic" way of assembling arrays of microspheres as compared to self-assembly approaches. An example of these techniques is represented by a suction array. Its fabrication can be performed in such a way that each cavity can hold exactly one micro part in a defined position. When the array is connected to a suction gripper and positioned over an incoherent batch of micro components, the air flow sucks the micro components into the cavities, which are then plugged and the air flow is cut off. When the array is filled up, excess micro components fall off or are not even grasped in the first place. In this way, a defined quantity of micro components can be picked up and aligned with a defined and constant pitch simultaneously.

The three developments described above, i) the concept of photonic nanojets, ii) the methods of self-assembly of microspherical arrays, and iii) the micro-assembly technologies, took place independently in three different research communities. The present invention combines the advantages of the efficient collection of light provided by the individual spheres with the advantages of large-scale self-assembly and micro-assembly techniques to produce photodetector FPAs with enhanced performance.

Figure 2:
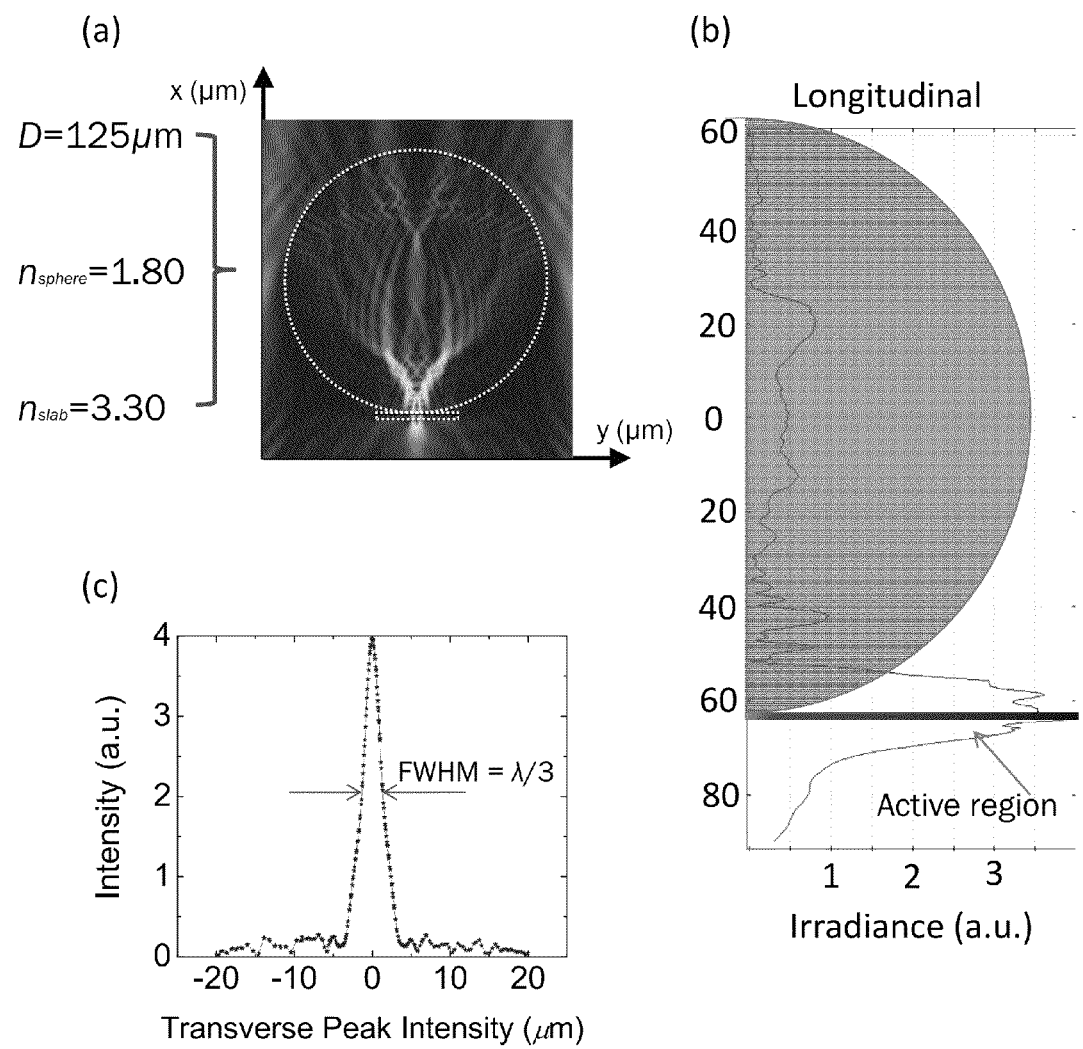
FIG. 2 illustrates (a) an electric field map calculated for the plane wave illumination of a 125 μm cylinder with n=1.80, (b) a longitudinal line profile of the irradiance, showing the beam waist in the near-surface region of the slab, and (c) a transverse line profile through the peak of the longitudinal line profile.

In many modern photodetector devices, QWIPs, QDIPs, and SLSIPs have mesas with lateral sizes below 20 µm. There are different designs of photodetector structures including front surface-illuminated and back-illuminated devices. In the case of front surface-illuminated structures, the photosensitive regions are located at a very small, micron-scale, depth below the surface of the structure. Using two-dimensional modeling by COMSOL Multiphysics for a wavelength $\lambda=4$ µm, we studied the focusing of light by a cylinder placed at the surface of a high-index (n=3.3) semiconductor slab, as illustrated in FIG. 2a. We demonstrated that the optimal cylinder index for focusing light in near-surface regions of the slab is n=1.8, as illustrated in FIG. 2b. We also showed that the transverse width of the beam at its waist is about $\lambda/3$, as illustrated in FIG. 2c. Thus, the photonic nanojet produced by a cylinder has a much smaller size than the size of the device mesa. Similar focusing effects are expected for dielectric microspheres. It can be concluded that for applications in MWIR detectors, $\lambda=3-5$ µm, one of the suitable materials for spheres is barium titanate glass, which has index around n~1.8 at these wavelengths. However, there are many other materials which are slightly sub-optimal in terms of their index, but can be still used in these applications. The examples include sapphire and ruby (n~1.73), polystyrene (n~1.56), etc.

Figure 3:
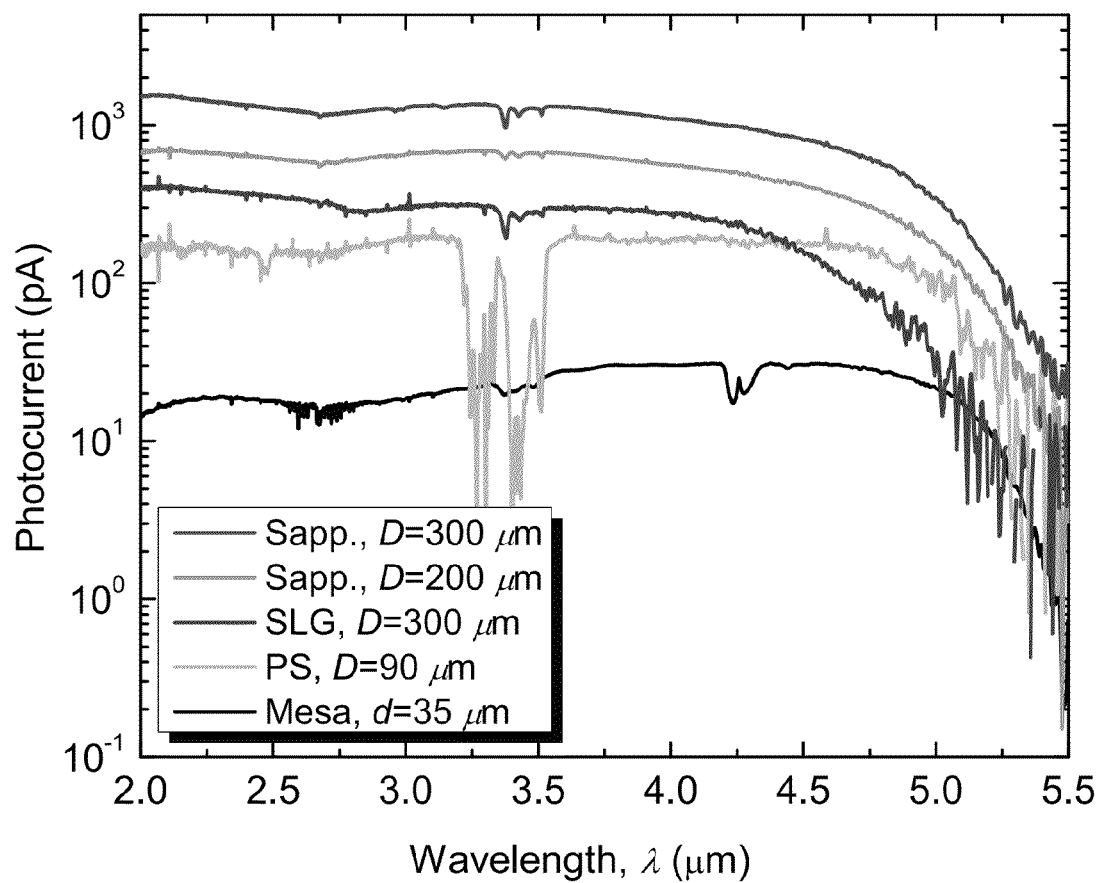
FIG. 3 illustrates a direct comparison of photocurrent measured from the same pixel, before and after integration with microspheres made from different dielectric materials and having different diameters. The photocurrent spectrum obtained from bare mesa is shown by black line. The photocurrent spectra measured after integration with spheres are illustrated using different colors: (red) sapphire sphere with D=300 μm, (green) sapphire sphere with D=200 μm, (violet) soda lime glass (SLG) sphere with D=300 μm, and (cyan) polystyrene sphere with D=90 μm. The plot illustrate significant photocurrent enhancement (up to 100 times) achieved as a result of integration with microspheres.

To demonstrate the advantage of single pixels integrated with individual microspheres, we used a number of spheres made from different materials and having different diameters, as illustrated in FIG. 3. The spheres were fixed into position using a silicone rubber. The spectral responses were characterized before and after positioning the microspheres. The results in FIG. 3 illustrate up to two orders of magnitude enhancement of the sensitivity of the detector equipped with the focusing microsphere. Additional dips visible in spectra of detectors integrated with different spheres are likely due to absorption in the material of spheres. Such dips have relatively narrow spectral width and, generally, do not provide a limitation for the performance of the broad band mid-IR imaging devices. Somewhat reduced response at the wavelengths longer than 4.5 micron is explained by the increased lateral dimensions of the focused spot. Due to imperfect alignment with the mesa center this factor leads to the partial blocking of the beam by the metallic electrodes surrounding the photodetector mesa. This factor can be minimized by the optimal structural design and better alignment of the spheres.

Figure 4:
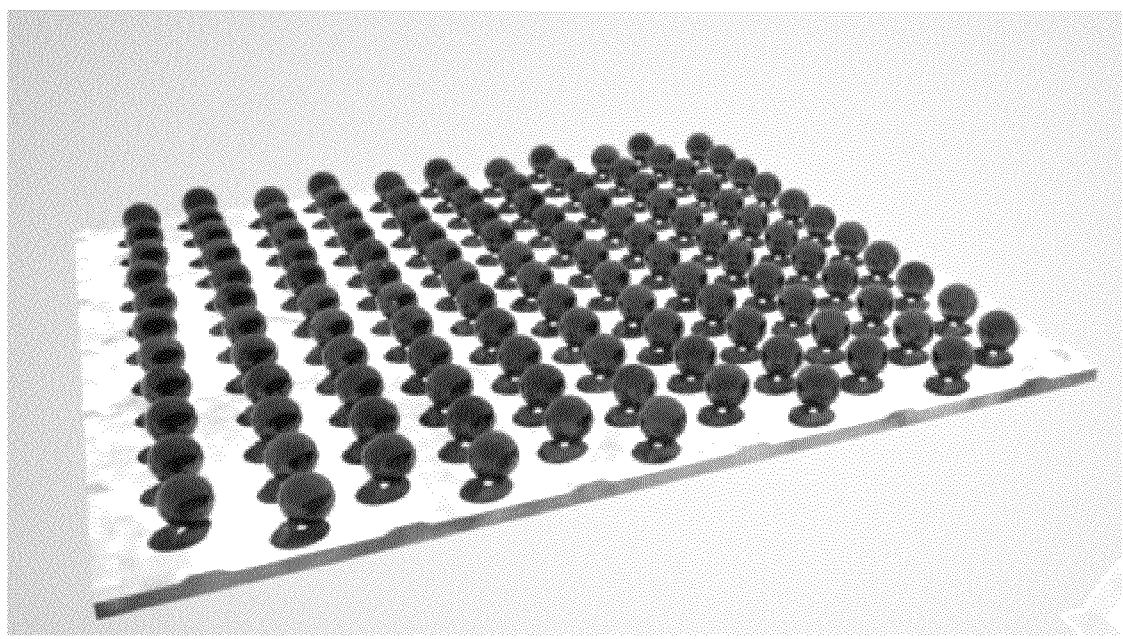
FIG. 4 illustrates the massive-scale integration of microspheres with a 2D array of pixels.

In the proposed methods and systems for enhancing the performance of FPAs, the massive number of microspheres needs to be positioned above the photosensitive mesas of the FPAs, as illustrated in FIG. 4. For example, making an enhanced 256×256 array would require the positioning of 65,536 spheres. This task can be solved by various techniques. The present invention is not limited to any specific self or micro-assembly technique. The examples of such methods include, but are not limited to: i) self-assembly under wet conditions due to meniscus forces, ii) the use of a patterned substrate, iii) the use of an electric field, iv) the use of shear force, v) the use of conventional and optoelectonic tweezers, vi) the use of a magnetic field, vii) self-assembly under dry conditions, viii) the use of vacuum tweezers, ix) the use of capillary grippers, and x) the use of suction arrays.

Figure 5:
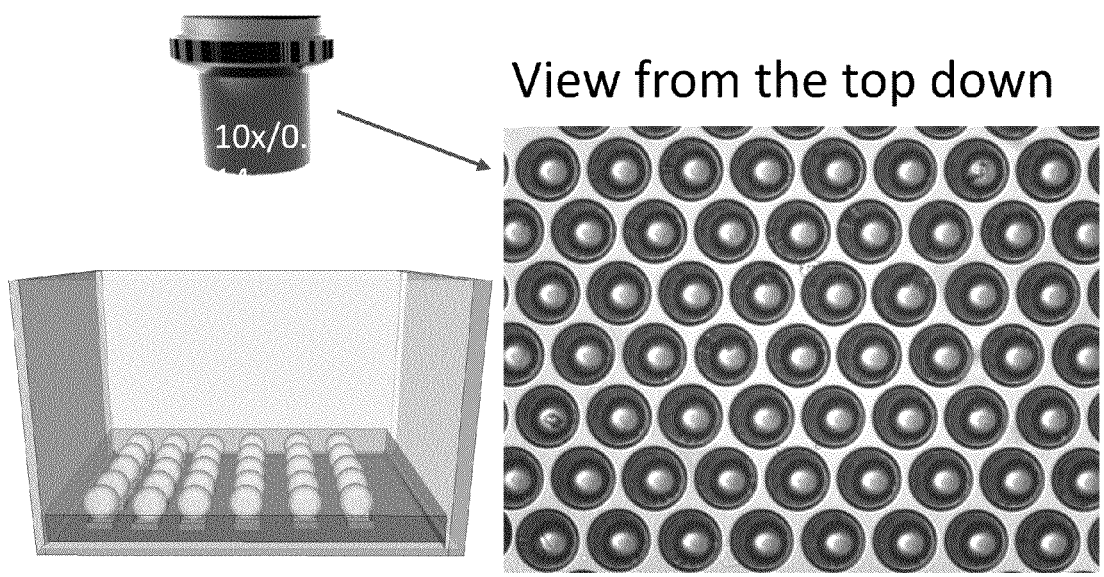
FIG. 5 illustrates the self-assembly of 90 μm polystyrene microspheres in 38 μm dents with 10 μm depth and 100 μm pitch—ordering was achieved in a layer of isopropanol with a thickness on the order of a sphere diameter.

In FIG. 5, we illustrate the results of our work on the wet self-assembly of 90 µm polystyrene microspheres in 38 µm dents with 10 µm depth fabricated in a photoresist. The choice of isopropanol as a liquid medium was determined by its fast evaporation properties and its small surface tension of 21.7 dynes/cm at 200 C. We found that water (surface tension 72.8 dynes/cm at 200 C) is a less favorable medium for this type of self-assembly. These results illustrate that the ordering of microspheres takes place when the thickness of the liquid layer is reduced to the size of individual spheres. Under these conditions, the surface of the evaporating liquid provides a downward pressure on spheres which stimulates their ordering in the prefabricated dents. In principle, the defect rate can be reduced to ~1% by using similar self-assembly techniques.

For applications in military or civil imaging systems, the spheres need to be fixed in the positions aligned with the mesas of the FPAs. This can be achieved by using glues, epoxies or, more generally, liquid or polymer materials with the ability to solidify, photocurable materials, or by using temperature treatments or otherwise. In addition, these materials should have relatively small absorption losses in the spectral range of interest. As an example, the plastic spheres in many practical cases can be fixed due to a controllable heating effect, so that the spheres are slightly melted and attached to the substrate due to a material reflow. Although this is accompanied by a change of the spherical shape of the lens, small deformations can be tolerated by the design of FPAs.

Placing the microspheres at the top of the photodetector FPAs can be considered as the "tiling" of corresponding lattices of pixels with the identical circular elements (as it can be viewed from the top). In terms of photosensitivity, it would mean that the size of each pixel is effectively determined by the size of corresponding microsphere integrated with this pixel. The densest packing is possible for touching circles packed in a triangular lattice with 0.9069 area fill factor. For square close-packed lattices of circles, the area fill factor is 0.7854. We do not present here detailed analysis of losses of the incident light due to its reflection at the spherical surface as well as due to light scattering in such close-packed monolayers of spheres. Calculations show that in most of the cases these losses are limited at ~10%. This means that integration with microspheres should increase the sensitivity of FPAs by more than an order of magnitude and in many cases by up to two orders of magnitude. Simultaneously, using pixels with the wavelength-scale dimensions should reduce the dark current by more than an order of magnitude. In addition, due to the decreased capacitance of each pixel, its frequency response should be significantly increased. Finally, in comparison with COTs microlenses, the integration with microspheres leads to very large AOVs. Typically, AOV>10 deg can be realized in most of the designs, however AOV>20 deg can also be achieved in such FPAs.

This technology results in the low-cost, high-volume production of photodetector FPAs. Barium titanate glass and polystyrene microspheres are available in massive quantities, such for example as ~$10^6$-$10^8$ spheres in a wet or dry sample which can be obtained from various manufacturers. They spheres are inexpensive. Sapphire and ruby spheres are not typically suitable for FPA production because of their high price, although they are not rules out here since large samples of these spheres can be obtained. The techniques of self-assembly and micro-assembly by a suction array are suitable for massive-scale production and are very inexpensive. Alternatively, low-defect rate massive-scale fabrication can be achieved by the self-assembly of microspheres on patterned electrodes by an applied electric field. The fabrication of FPAs integrated with microspheres seems to be easier to realize for MWIP and LWIP because of the longer pitch of the array, which allows using larger spheres.

Potential markets for this technology include companies and governmental laboratories working on increasing the sensitivity of current MWIPs and LWIPs. Current IR multispectral imagers are large and difficult to integrate on small size, weight, and power (SWaP)-limited platforms, such as Puma, Shadow, and Tube Launched Expendable UAS (TLEU). The deficiency of these imagers is their large optical systems, which are needed to simultaneously collect both the spatial and spectral data. Detecting weak signals requires large objective diameters, which translate into the large size and weight of the optical system. Integration with microspheres opens a unique way of solving this problem by increasing of the response of the system, increasing AOV and reducing its dark current by orders of magnitude.

One of the competing approaches to solving the problems addressed by this invention is represented by the concept of the flat metamaterial lens. Due to its planar design and potentially short focal lengths, this concept attracted significant interest recently. In particular, a design of such a flat lens has been proposed based on a stack of strongly coupled waveguides sustaining backward waves. As a result, such metamaterial exhibits a negative index of refraction to incoming light regardless of its incidence angle. It should be noted, however, that the concept of flat metamaterial lens has some drawbacks which are not totally overcome at the present time. These include a relatively narrow spectral range of operation, the inevitable absorption losses in the metallic layers, and somewhat complicated fabrication. Overall, this concept still requires significant development before it can become a practical solution for solving problems addressed by this invention.

Another competing approach is based on using standard photolithography techniques, which allows the fabrication of 2D arrays of microlenses. The fabrication of microlenses by melting and reflow of photoresist has some advantages because it is based on using established planar technologies, such as photolithography, etching, etc. For this reason, it allows the reproducible fabrication of 2D arrays of microlenses over wide areas. However, the dome-shaped microlenses fabricated by this method have a limited refractive index contrast and they are far from being completed spheres. As a result, their focal length is much longer than in methods and systems proposed in this invention. As shown earlier in this patent application, this results in very small AOVs of such systems which made them impractical in many mid-IR imaging applications. In this sense, such arrays cannot compete with the methods and systems for near-surface focusing proposed in this invention.

Another competing approach is based on using microspheres embedded in thin films. Such microspheres have been used as lenses for projection photolithography. For photodetector applications, the spheres need to be aligned with the photosensitive mesas. This problem has not been stated and solved yet.

Theoretically, the idea of using an individual microsphere for more efficient coupling of light into the photosensitive area of photodetector has been expressed previously. However, this proposal has not been analyzed in comparison with COTs microlenses which have been known for a long time as a tool for concentrating light on the detectors. In this patent, we show that integration with microspheres allows combining high light collection efficiency with large AOVs which is a unique advantage of such detectors. Another important feature which has not been considered in previous proposal of using photonic nanojets for photodetectors is an ability to assemble microspheres in a regular array to make possible fabrication of FPAs.

As we stated previously, there have been multiple studies of directed self-assembly and micro-manipulation assembly of microspheres. In some cases, these studies have been performed with the goal of positioning microspheres on patterned electrodes or inside prefabricated dents. However, these studies have not been intended to be used for enhancing the performance of photodetector FPAs. For this reason, corresponding analysis of the essential physical parameters, such as the relationship between the size of the photonic nanojets and size and depth of the photosensitive regions, have not been performed. The whole inventive idea of the proposed methods based on the simultaneous use of light focusing and manufacturing advantages provided by microspheres have not been expressed.

Although the present invention is illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention, are contemplated thereby, and are intended to be covered by the following claims.

What is claimed is:

1. A photodetector focal plane array system, comprising:
   a substrate comprising a plurality of photosensitive regions; and
   a microcomponent disposed adjacent to each of the plurality of photosensitive regions operable for receiving incident radiation and directing a photonic nanojet into the associated photosensitive region;
   wherein each of the microcomponents has a width that is larger than a width of a mesa of the associated photosensitive region and is centered with the mesa of the associated photosensitive region.

2. The photodetector focal plane array system of claim 1, wherein the plurality of photosentive regions are disposed in a photosensitive layer of the substrate.

3. The photodetector focal plane array system of claim 1, wherein each of the microcomponents comprises one of a microsphere and a microcylinder, and wherein each of the microcomponents has a diameter that is larger than a diameter of the mesa of the associated photosensitive region.

4. The photodetector focal plane array system of claim 1, wherein each of the microcomponents has a diameter of between about $\lambda$ and about $100\lambda$, wherein $\lambda$ is the wavelength of the incident radiation.

5. The photodetector focal plane array system of claim 1, wherein each of the microcomponents is manufactured from one of a dielectric material and a semiconductor material.

6. The photodetector focal plane array system of claim 5, wherein the dielectric material comprises one or more of barium titanate glass, titanium dioxide, sapphire, ruby, polystyrene, soda-lime glass, silica, borosilicate glass, calcium fluoride, and magnesium fluoride.

7. The photodetector focal plane array system of claim 1, wherein each of the microcomponents has an index of refraction of between about 1.4 and about 3.5.

8. The photodetector focal plane array system of claim 5, wherein the semiconductor material comprises one or more of silicon, germanium, and GaAs.

9. The photodetector focal plane array of claim 1, wherein the microcomponents are assembled with the substrate using one or more of the following techniques: i) self-assembly under wet conditions due to meniscus forces, ii) the use of a patterned substrate, iii) the use of an electric field, iv) the use of shear force, v) the use of conventional or optoelectronic tweezers, vi) the use of a magnetic field, vii) self-assembly under dry conditions, viii) the use of vacuum tweezers, ix) the use of capillary grippers, and x) the use of suction arrays.

10. The photodetector focal plane array of claim 1, wherein the microcomponents are affixed to the substrate using one or more of a glue, an epoxy, a polymeric material, a photocurable material, and partial or complete melting.

11. The photodetector focal plane array of claim 1, wherein the micrcomponents form an array of microcomponents disposed adjacent to the substrate.

12. A photodetector focal plane array method, comprising:
provide a substrate comprising a plurality of photosensitive regions; and
disposing a microcomponent adjacent to each of the plurality of photosensitive regions operable for receiving incident radiation and directing a photonic nanojet into the associated photosensitive region;
wherein each of the microcomponents has a width that is larger than a width of a mesa of the associated photosensitive region and is centered with the mesa of the associated photosensitive region.

13. The photodetector focal plane array method of claim 12, wherein the plurality of photosentive regions are disposed in a photosensitive layer of the substrate.

14. The photodetector focal plane array method of claim 12, wherein each of the microcomponents comprises one of a microsphere and a microcylinder, and wherein each of the microcomponents has a diameter that is larger than a diameter of the mesa of the associated photosensitive region.

15. The photodetector focal plane array method of claim 12, wherein each of the microcomponents has a diameter of between between about $\lambda$ and about $100\lambda$, wherein $\lambda$ is the wavelength of the incident radiation.

16. The photodetector focal plane array method of claim 12, wherein each of the microcomponents is manufactured from one of a dielectric material and a semiconductor material.

17. The photodetector focal plane array method of claim 15, wherein the dielectric material comprises one or more of barium titanate glass, titanium dioxide, sapphire, ruby, polystyrene, soda-lime glass, silica, borosilicate glass, calcium fluoride, and magnesium fluoride.

18. The photodetector focal plane array method of claim 12, wherein each of the microcomponents has an index of refraction of between about 1.4 and about 3.5.

19. The photodetector focal plane array method of claim 16, wherein the semiconductor material comprises one or more of silicon, germanium, and GaAs.

20. The photodetector focal plane array method of claim 12, further comprising assembling the microcomponents with the substrate using one or more of the following techniques: i) self-assembly under wet conditions due to meniscus forces, ii) the use of a patterned substrate, iii) the use of an electric field, iv) the use of shear force, v) the use of conventional or optoelectonic tweezers, vi) the use of a magnetic field, vii) self-assembly under dry conditions, viii) the use of vacuum tweezers, ix) the use of capillary grippers, and x) the use of suction arrays.

21. The photodetector focal plane array method of claim 12, further comprising affixing the microcomponents to the substrate using one or more of a glue, an epoxy, a polymeric material, a photocurable material, and partial or complete melting.

22. The photodetector focal plane array method of claim 12, wherein the micrcomponents form an array of microcomponents disposed adjacent to the substrate.

* * * * *